US012772672B2

(12) United States Patent
Zhou et al.

(10) Patent No.: US 12,772,672 B2
(45) Date of Patent: Oct. 20, 2026

(54) DISPLAY PANEL, FABRICATION METHOD OF DISPLAY PANEL, AND DISPLAY DEVICE

(71) Applicant: Xiamen Tianma Display Technology Co., Ltd., Xiamen (CN)

(72) Inventors: Zhiwei Zhou, Xiamen (CN); Wenxin Lin, Xiamen (CN); Zhipeng Yang, Xiamen (CN); Qinqin Liu, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 451 days.

(21) Appl. No.: 18/117,959

(22) Filed: Mar. 6, 2023

(65) Prior Publication Data

US 2024/0298479 A1 Sep. 5, 2024

(30) Foreign Application Priority Data

Nov. 25, 2022 (CN) ......................... 202211496065.0

(51) Int. Cl.
*H10K 59/124* (2023.01)
*H10K 59/12* (2023.01)
*H10K 59/90* (2026.01)
*H10W 90/00* (2026.01)

(52) U.S. Cl.
CPC ....... *H10K 59/124* (2023.02); *H10K 59/1201* (2023.02); *H10K 59/90* (2023.02); *H10W 90/00* (2026.01)

(58) Field of Classification Search
CPC .. H10K 59/124; H10K 59/1201; H10K 59/90; H01L 25/18; H10W 90/00
See application file for complete search history.

(56) References Cited

U.S. PATENT DOCUMENTS

2009/0039495 A1* 2/2009 Yamashita ............. H05K 3/303 257/784

* cited by examiner

*Primary Examiner* — Benjamin Tzu-Hung Liu
(74) *Attorney, Agent, or Firm* — Anova Law Group, PLLC

(57) ABSTRACT

A display panel includes a substrate, an insulating layer arranged at one side of the substrate, a conductive adhesive layer arranged at one side of the insulating layer away from the substrate, and a chip arranged at one side of the conductive adhesive layer away from the substrate. The insulating layer is provided with an accommodation groove, and first electrodes are arranged within the accommodation groove. Along a direction perpendicular to a plane where the substrate is located, an orthographic projection of the conductive adhesive layer on the substrate covers an orthographic projection of the accommodation groove on the substrate. Part of the conductive adhesive layer is in contact with the first electrodes, and the chip is in contact with the conductive adhesive layer. A channel is provided in the insulating layer for the accommodation groove to communicate with outside.

14 Claims, 12 Drawing Sheets

DISPLAY PANEL, FABRICATION METHOD OF DISPLAY PANEL, AND DISPLAY DEVICE

CROSS-REFERENCE TO RELATED APPLICATION

This application claims the priority to Chinese patent application No. 202211496065.0, filed on Nov. 25, 2022, the entirety of which is incorporated herein by reference.

TECHNICAL FIELD

The present disclosure relates to the technical field of display and, more particularly, to a display panel, a fabrication method of display panel, and a display device.

BACKGROUND

With the advancement of technology, digital display devices such as smart phones and tablet computers have been widely used, and a display panel is an indispensable interpersonal communication interface in these display devices. The display panel such as an organic light emitting diode (OLED), which has the advantages of self-illumination, energy saving, bendability, good flexibility, etc., has attracted attention of users and is widely used in terminal products such as smart phones and tablet computers.

A bonding process is to realize an electrical connection between the display panel and a chip through a conductive adhesive layer. Due to structural limitations of existing display panel, the conductive adhesive layer may have bubbles or holes during bonding, which affects reliability of the display panel.

Therefore, a new display panel, fabrication method of display panel, and display device are in urgent need.

SUMMARY

In accordance with the disclosure, there is provided a display panel including a substrate, an insulating layer arranged at one side of the substrate, a conductive adhesive layer arranged at one side of the insulating layer away from the substrate, and a chip arranged at one side of the conductive adhesive layer away from the substrate. The insulating layer is provided with an accommodation groove, and first electrodes are arranged within the accommodation groove. Along a direction perpendicular to a plane where the substrate is located, an orthographic projection of the conductive adhesive layer on the substrate covers an orthographic projection of the accommodation groove on the substrate. Part of the conductive adhesive layer is in contact with the first electrodes, and the chip is in contact with the conductive adhesive layer. A channel is provided in the insulating layer for the accommodation groove to communicate with outside.

Also in accordance with the disclosure, there is provided a fabrication method of a display panel including providing a substrate; forming an insulating layer at one side of the substrate; patterning the insulating layer to form an accommodation groove, and forming first electrodes within the accommodation groove; forming a channel in the insulating layer for the accommodation groove to communicate with outside; forming a conductive adhesive layer at one side of the insulating layer away from the substrate, an orthographic projection of the conductive adhesive layer on the substrate covering an orthographic projection of the accommodation groove on the substrate in a direction perpendicular to a plane where the substrate is located; and providing a chip, and applying pressure on one side of the chip to cause the chip to be in contact with the conductive adhesive layer and to cause part of the conductive adhesive layer to be in contact with the first electrodes.

Also in accordance with the disclosure, there is provided a display device including a display panel. The display panel includes a substrate, an insulating layer arranged at one side of the substrate, a conductive adhesive layer arranged at one side of the insulating layer away from the substrate, and a chip arranged at one side of the conductive adhesive layer away from the substrate. The insulating layer is provided with an accommodation groove, and first electrodes are arranged within the accommodation groove. Along a direction perpendicular to a plane where the substrate is located, an orthographic projection of the conductive adhesive layer on the substrate covers an orthographic projection of the accommodation groove on the substrate. Part of the conductive adhesive layer is in contact with the first electrodes, and the chip is in contact with the conductive adhesive layer. A channel is provided in the insulating layer for the accommodation groove to communicate with outside.

BRIEF DESCRIPTION OF THE DRAWINGS

In order to explain the technical solutions in the embodiments of the present disclosure more clearly, reference is made to the accompanying drawings, which are used in the embodiments of the present disclosure. Obviously, the drawings in the following description are some embodiments of the present disclosure, and other drawings can be obtained from these drawings without any inventive effort for those of ordinary skill in the art.

DETAILED DESCRIPTION OF THE EMBODIMENTS

The features and exemplary embodiments of the present disclosure will be described in detail below. There are many specific details in the following detailed description in order to provide a comprehensive understanding of the present disclosure. However, it is obvious to those skilled in the art that the present disclosure can be implemented without some of these specific details. The following description of the embodiments is only to provide a better understanding of the present disclosure by showing examples of the present disclosure.

It should be noted that relational terms such as first and second are only used herein to distinguish one entity or operation from another entity or operation, and do not necessarily require or imply any such actual relationship or order between these entities or operations. Also, the terms "include," "involve" or any other variations thereof are intended to cover non-exclusive inclusion, so that a process, method, object, or device including a series of elements not only includes those elements, but also includes other elements that are not explicitly listed, or also includes elements inherent to such processes, method, object, or device. Without further restrictions, the element associated with phrase "including . . . " does not exclude the existence of other identical elements in the process, method, object, or device that includes the element.

Figure 1:
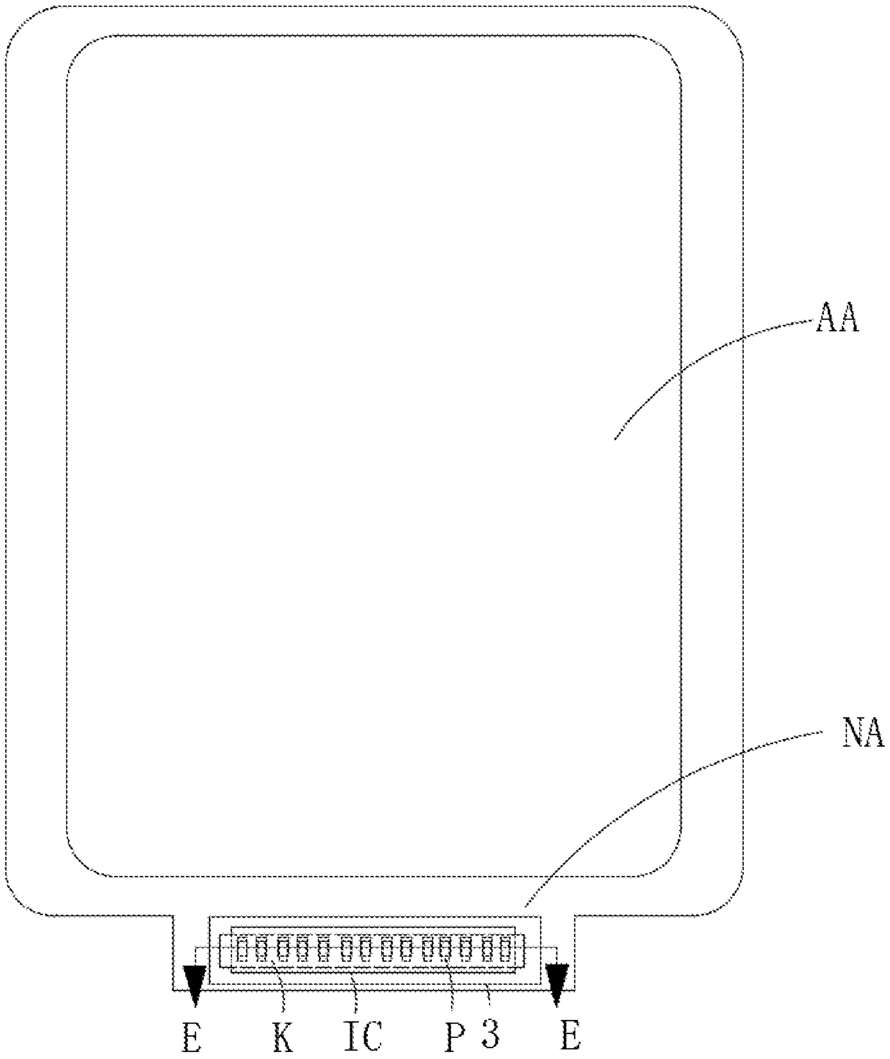
FIG. 1 is a schematic top view of a display panel according to an embodiment in related technologies.
Figure 2:
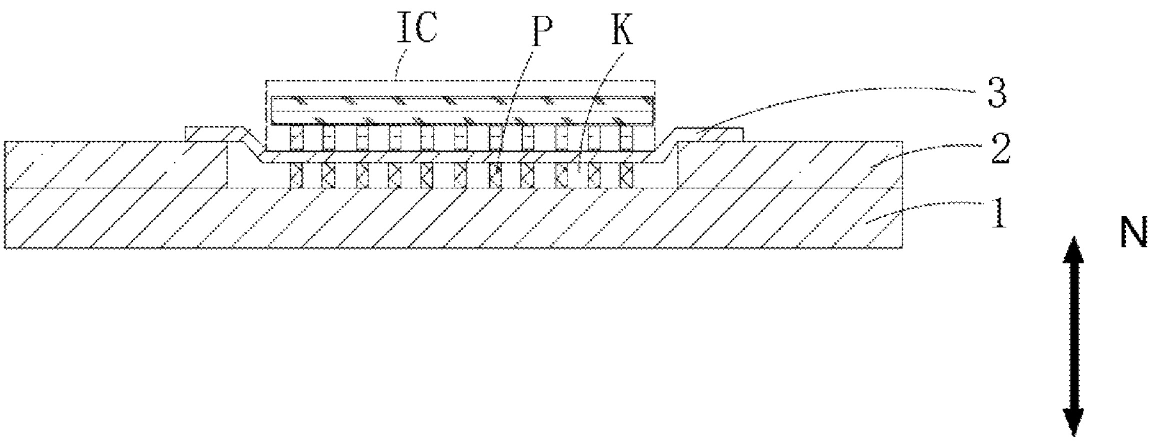
FIG. 2 is a schematic cross-sectional view of a display panel in FIG. 1 along direction E-E.

FIG. 1 is a schematic top view of a display panel according to an embodiment in related technologies, and FIG. 2 is a schematic cross-sectional view of the display panel in FIG. 1 along direction E-E. In the related technologies, the display panel includes a display area AA and a non-display area NA. The non-display area NA includes first electrodes P and a chip IC, and the chip IC and the first electrodes P are electrically connected through a bonding process, so that the chip IC can transmit voltage signals to the display area AA through the first electrodes P to realize light emission display of the display panel. In order to form a good electrical connection between the first electrodes P and the chip IC of the display panel, a conductive adhesive layer 3 is usually provided between the first electrodes P and the chip IC. Considering factors such as equipment accuracy and attachment error, size of the conductive adhesive layer 3 will exceed area of an accommodation groove K where the first electrodes P are arranged. Since there is a large step difference in the area of the accommodation groove K, some closed spaces will be formed when the conductive adhesive layer 3 is attached, and gas will be wrapped therein. When the first electrodes P and the chip IC are bonded, the closed spaces are squeezed and internal pressure increases, which causes bubbles or holes to the conductive adhesive layer 3, resulting in a lack of sealing of the conductive adhesive layer 3 and affecting reliability of the display panel.

In order to solve the above-mentioned problems, a display panel provided by the embodiments of the present disclosure discharges the gas outward by providing a channel, thereby maintaining a balance of air pressure inside the accommodation groove K and outside. Therefore, bubbles or holes in the conductive adhesive layer 3 can be avoided, which improves the reliability of the display panel and meets specification requirements of customers.

In order to better understand the present disclosure, a display panel, a fabrication method of the display panel, and a display device consistent with the present disclosure will be described in detail below with reference to FIGS. 3 to 22.

Figure 3:
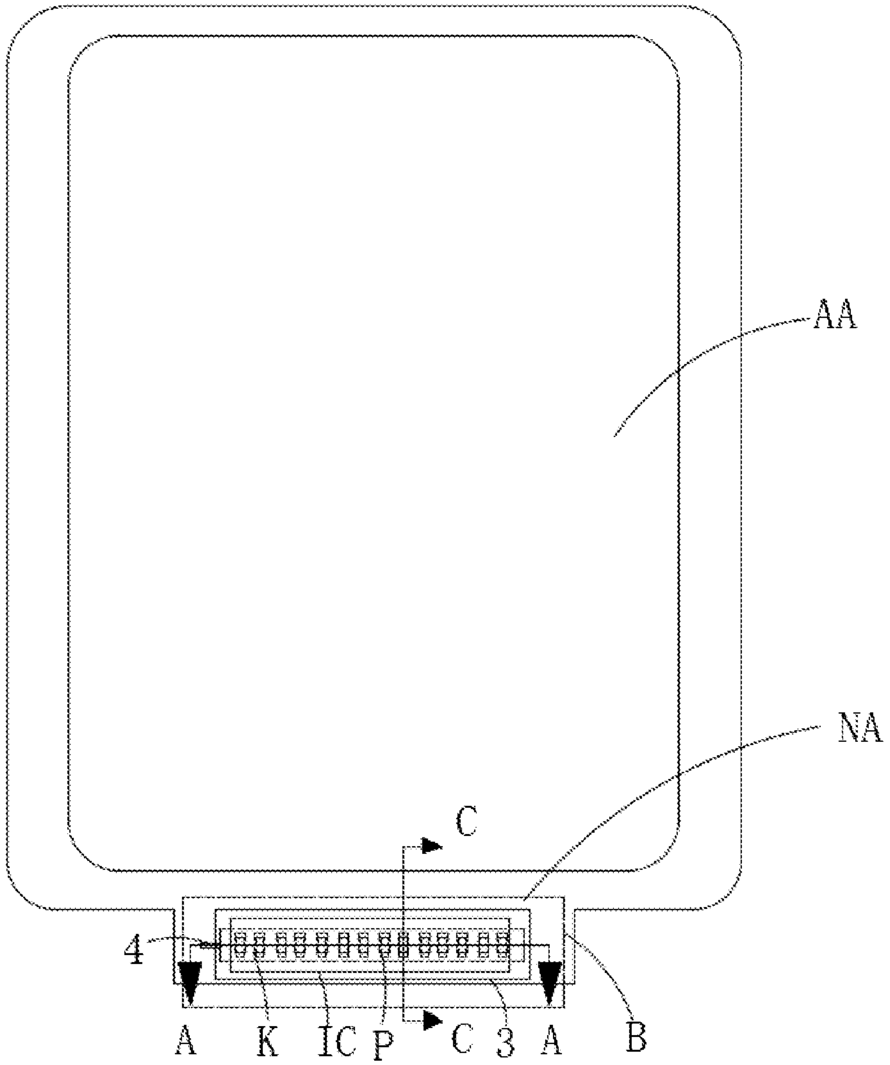
FIG. 3 is a schematic top view of a display panel according to an embodiment of the present disclosure.
Figure 4:
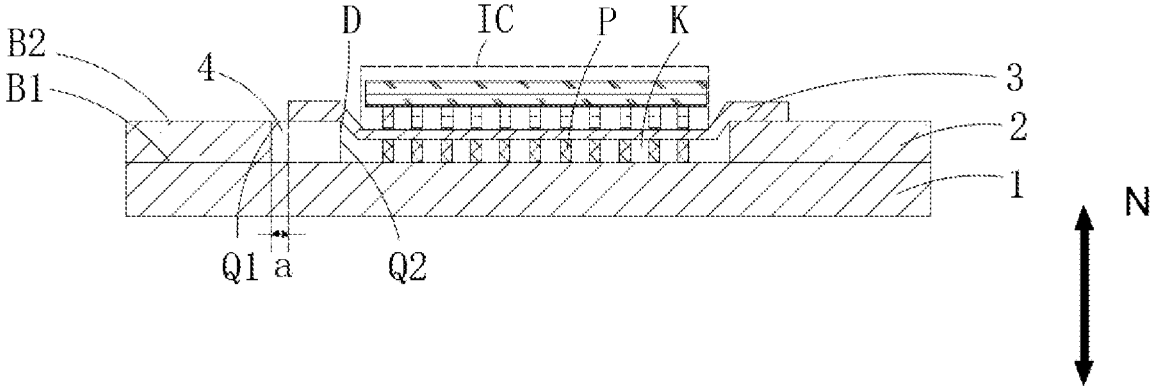
FIG. 4 is a schematic cross-sectional view of a display panel in FIG. 3 along direction A-A according to an embodiment of the present disclosure.
Figure 5:
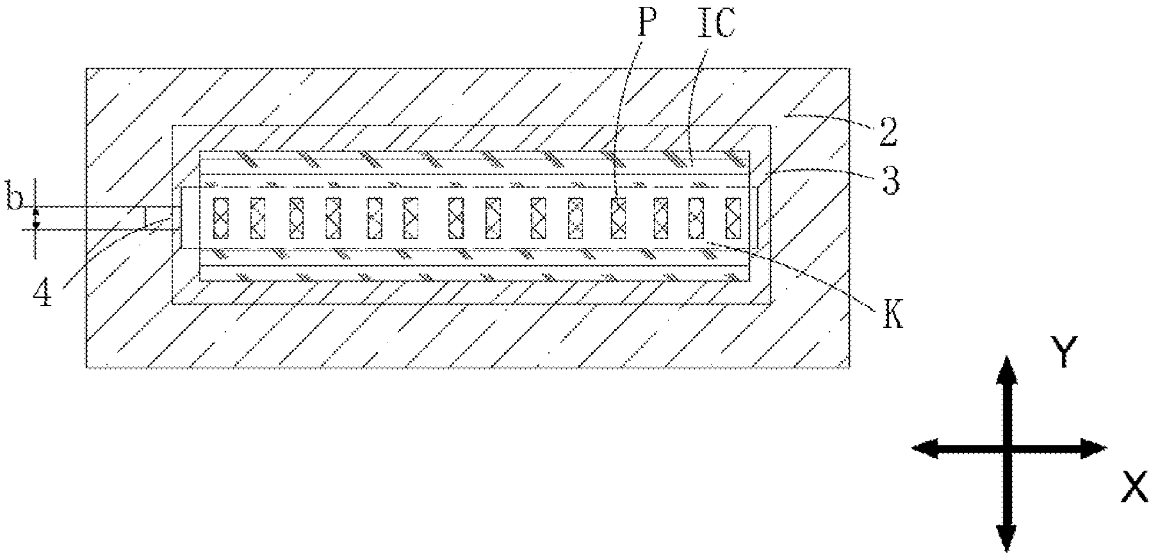
FIG. 5 is a partial enlarged view at B in FIG. 3 according to an embodiment of the present disclosure.

FIG. 3 is a schematic top view of a display panel according to an embodiment of the present disclosure. FIG. 4 is a schematic cross-sectional view of the display panel in FIG. 3 along direction A-A according to an embodiment of the present disclosure. FIG. 5 is a partial enlarged view at B in FIG. 3 according to an embodiment of the present disclosure.

The embodiments of the present disclosure provide a display panel, which includes a substrate 1, an insulating layer 2 arranged at one side of the substrate 1, the conductive adhesive layer 3 arranged at one side of the insulating layer 2 away from the substrate 1, and the chip IC arranged at one side of the conductive adhesive layer 3 away from the substrate 1. The insulating layer 2 is provided with the accommodation groove K, and the first electrodes P are arranged within the accommodation groove K. Along direction N perpendicular to a plane where the substrate 1 is located, an orthographic projection of the conductive adhesive layer 3 on the substrate 1 covers an orthographic projection of the accommodation groove K on the substrate 1. Part of the conductive adhesive layer 3 is in contact with the first electrodes P, and the chip IC is in contact with the conductive adhesive layer 3. A channel 4 is provided in the insulating layer 2 for the accommodation groove K to communicate with the outside.

It can be understood that, as shown in FIG. 4, the chip IC includes a plurality of pins which are in contact with the conductive adhesive layer 3 and correspond to the first electrodes P.

The display panel provided by the embodiments of the present disclosure includes the substrate 1, the insulating layer 2, the first electrodes P, the conductive adhesive layer 3, and the chip IC. The orthographic projection of the conductive adhesive layer 3 on the substrate 1 covers the orthographic projection of the accommodation groove K on the substrate 1, i.e., the conductive adhesive layer 3 covers the accommodation groove K, so as to ensure that the chip IC and the first electrodes P can form a good electrical connection through the conductive adhesive layer 3. Also, the channel 4 is provided in the insulating layer 2 of the display panel for the accommodation groove K to communicate with the outside. In this way, when the first electrodes P and the chip IC are bonded and then the conductive adhesive layer 3 is squeezed, the channel 4 can be used to discharge the gas located between the accommodation groove K and the conductive adhesive layer 3 to the outside, so as to maintain the balance of the air pressure inside the accommodation groove K and the outside. Therefore, bubbles or holes in the conductive adhesive layer 3 can be avoided, which improves the reliability of the display panel and meets the specification requirements of the customers.

The channel 4 and the accommodation groove K in the embodiments of the present disclosure can be formed by a patterning process such as etching. In some embodiments, the etching can be a dry etching process or a wet etching process.

It should be noted that a difference between dry etching and wet etching is that the wet etching uses a solvent or solution to etch. The wet etching is a purely chemical reaction process, which refers to use of chemical reaction between the solution and pre-etched materials to remove parts not masked by masking film materials to achieve etching purpose. The advantages thereof are good selectivity, good repeatability, high production efficiency, simple equipment, and low cost. While there are many types of dry etching, including laser etching, light volatilization, vapor phase etching, plasma etching, etc. The advantages of dry etching are good anisotropy, high selection ratio, good controllability, good flexibility, good repeatability, safe operation of thin lines, easy automation, no chemical waste liquid, no pollution introduced in the process, and high cleanliness.

In some embodiments, a specific solution can be selected according to material of the insulating layer 2 to etch the insulating layer 2, or a laser can be used to directly etch the insulating layer 2, so as to form the accommodation groove K or channel 4, which is simple and convenient to operate, and process precision is high.

The substrate 1 in the embodiments of the present disclosure may be a hard substrate, such as a glass substrate, or a flexible substrate, and material thereof may be polyimide, polystyrene, polyethylene terephthalate, parylene, polyethersulfone, or polyethylene naphthalate. The substrate 1 is mainly configured to support devices arranged thereat.

In some embodiments, the insulating layer 2 may be made of organic materials, such as hexamethyldisiloxane, epoxy resin, polyimide, or other resin materials, to improve flatness of the insulating layer 2. In some other embodiments, the insulating layer 2 may also be made of inorganic materials, such as silicon nitride, silicon oxide, silicon oxynitride, etc., to improve insulating and water-oxygen barrier effects of the insulating layer 2.

In some embodiments, the conductive adhesive layer is an anisotropic conductive film (ACF). The anisotropic conductive film mainly includes two parts: resin adhesive and conductive particles. In addition to having moisture-proof, heat-resistant, and insulating functions, the resin adhesive is mainly configured to fix the chip IC and the first electrodes P to ensure bonding stability. The conductive particles are mainly metal powders or polymer plastic balls coated with metal, which are configured to connect the first electrodes P and the chip IC.

Figure 6:
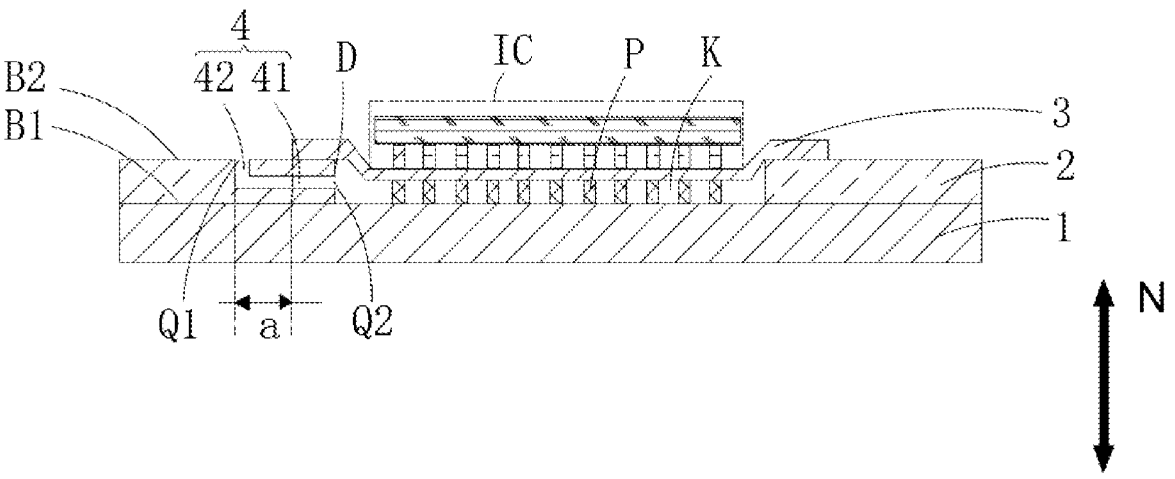
FIG. 6 is a schematic cross-sectional view of a display panel in FIG. 3 along direction A-A according to another embodiment of the present disclosure.

FIG. 6 is a schematic cross-sectional view of the display panel in FIG. 3 along direction A-A according to another embodiment of the present disclosure. In some embodiments, along the direction N perpendicular to the plane where the substrate 1 is located, an orthographic projection of the channel 4 on the substrate 1 and the orthographic projection of the conductive adhesive layer 3 on the substrate 1 partially overlap, and the orthographic projection of the channel 4 on the substrate 1 extends a predetermined distance a away from the first electrodes P relative to the orthographic projection of the conductive adhesive layer 3 on the substrate 1.

It should be noted that the orthographic projection of the channel 4 on the substrate 1 and the orthographic projection of the conductive adhesive layer 3 on the substrate 1 partially overlap, which means that at least part of the channel 4 is opened in part of the insulating layer 2 covered by the conductive adhesive layer 3, so that the channel 4 can communicate with the accommodation groove K. In some embodiments, the orthographic projection of the channel 4 on the substrate 1 extends the predetermined distance a away from the first electrodes P relative to the orthographic projection of the conductive adhesive layer 3 on the substrate 1, i.e., part of the channel 4 that overlaps with the conductive adhesive layer 3 will extend the predetermined distance a away from the first electrodes P, so as to stagger part of the channel 4 for gas outlet and the conductive adhesive layer 3, which avoids large impact of the gas discharged from the channel 4 on the conductive adhesive layer 3, and improves the reliability of the conductive adhesive layer 3.

In some embodiments, the predetermined distance a is greater than or equal to 1 μm. It should be noted that the predetermined distance a should not be too large. If it is too large, the channel 4 will be too long, which is not conducive to processing. The predetermined distance a should not be too short. If it is too short, the part of the channel 4 for gas outlet is too close to the conductive adhesive layer 3, which will cause the gas discharged from the channel 4 to have a greater impact on the conductive adhesive layer 3, affecting the reliability of the conductive adhesive layer 3. In some embodiments, the predetermined distance a may be equal to 1 μm, 2 μm, 3 μm, 4 μm, etc.

Referring to FIG. 4, in some embodiments, the channel 4 passes through the insulating layer 2 and exposes part of the substrate 1.

It can be understood that in some embodiments, part of the insulating layer 2 located below the conductive adhesive layer 3 and adjacent to edges of the conductive adhesive layer 3 can be removed by processes such as etching to form the channel 4. Since the channel 4 passes through the insulating layer 2, there is no need to process inside the insulating layer 2, and the channel 4 is convenient to open and easy to operate. It can be understood that when the channel 4 passes through the insulating layer 2 and communicates with the accommodation groove K, the part of the channel 4 for gas outlet can be relatively large so as to quickly discharge the gas in the accommodation groove K.

Considering that a form of the channel 4 passing through the insulating layer 2 may affect stability of the insulating layer 2 to support the conductive adhesive layer 3, in some other embodiments, referring to FIG. 6, size of the channel 4 along the direction perpendicular to the plane where the substrate 1 is located is smaller than size of the insulating layer 2 along the direction perpendicular to the plane where the substrate 1 is located.

It should be noted that when the size of the channel 4 along the direction perpendicular to the plane where the substrate 1 is located is equal to the size of the insulating layer 2 along the direction perpendicular to the plane where the substrate 1 is located, it corresponds to the above-mentioned form of the channel 4 passing through the insulating layer 2. While in some embodiments, the size of the channel 4 along the direction perpendicular to the plane where the substrate 1 is located is smaller than the size of the insulating layer 2 along the direction perpendicular to the plane where the substrate 1 is located, which specifically refers to that the channel 4 does not pass through the insulating layer 2 but instead is arranged inside the insulating layer 2, and part of the insulating layer 2 is reserved to ensure structural strength of the insulating layer 2, thereby avoiding problems such as collapse of the conductive adhesive layer 3.

Referring to FIG. 4 or FIG. 6, in some embodiments, the substrate 1 has a first surface B1, and the first electrodes P are arranged at the first surface B1. The insulating layer 2 has a second surface B2 and a side surface D, where the second surface B2 is parallel to the first surface B1, and the side surface D connects the first surface B1 and the second surface B2. The channel 4 includes an inlet Q2 and an outlet Q1, where the inlet Q2 is arranged at the side surface D, and the outlet Q1 is arranged at the second surface B2.

It can be understood that when the inlet Q2 is arranged at the side surface D of the insulating layer 2, and the outlet Q1 is arranged at the second surface B2 of the insulating layer 2, an extension track of the channel 4 on the insulating layer 2 is not particularly limited, which can be in a form of a straight line, a curve, or a broken line, as long as the inlet Q2 can be arranged at the side surface D, and the outlet Q1 can be arranged at the second surface B2. The gas in the accommodation groove K can enter interior of the insulating layer 2 from the inlet Q2 of the side surface D and be discharged from the outlet Q1 of the second surface B2.

In some embodiments, referring to FIG. 6, the channel 4 includes a first hole segment 41 and a second hole segment 42 that are connected, where an extension direction of the first hole segment 41 is parallel to the first surface B1, and an extension direction of the second hole segment 42 is perpendicular to the first surface B1. Along a direction perpendicular to the first surface B1, an orthographic projection of the first hole segment 41 on the substrate 1 and the orthographic projection of the conductive adhesive layer 3 on the substrate 1 partially overlap, and an orthographic projection of the second hole segment 42 on the substrate 1 and the orthographic projection of the conductive adhesive layer 3 on the substrate 1 do not overlap.

It can be understood that since the orthographic projection of the conductive adhesive layer 3 on the substrate 1 covers the orthographic projection of the accommodation groove K on the substrate 1 along the direction N perpendicular to the plane where the substrate 1 is located, it is needed to arrange the first hole segment 41 parallel to the first surface B1 of the substrate 1, where the first hole segment 41 extends away from the first electrodes P to avoid the conductive adhesive layer 3, and the inlet Q2 of the channel 4 is formed in the first hole segment 41.

Meanwhile, since the extension direction of the first hole segment 41 is parallel to the first surface B1, and the first hole segment 41 is provided inside the insulating layer 2, the second hole segment 42 also needs to be provided in order to communicate with the outside. The extension direction of the second hole segment 42 is perpendicular to the first surface B1, and the second hole segment 42 directly extends to the second surface B2 of the insulating layer 2 to form the outlet Q1. When the conductive adhesive layer 3 is squeezed, the first hole segment 41 and the second hole segment 42 cooperate to discharge the gas in the accommodation groove K, so as to maintain the balance of the air pressure inside the accommodation groove K and the outside.

In some embodiments, both the first hole segment 41 and the second hole segment 42 may be straight lines, which can improve gas discharge efficiency and facilitate fabrication. In some other embodiments, depending on different arrangement position and length of the channel 4, the channel 4 may also include more hole segments, such as a third hole segment connected to the second hole segment 42. Any structural forms of the channel 4 that can communicate the accommodation groove K with the outside can all be applied to the embodiments of the present disclosure.

In some embodiments, as shown in FIG. 5, in a plane parallel to the substrate 1 and along a direction perpendicular to an extension direction of the channel 4, width b of the channel 4 ranges from 4 μm to 10 μm. For example, the width b of the channel 4 may be 4 μm, 6 μm, 8 μm, or 10 μm.

Considering that along the direction N perpendicular to the plane where the substrate 1 is located, the orthographic projection of the channel 4 on the substrate 1 and the orthographic projection of the conductive adhesive layer 3 on the substrate 1 partially overlap, i.e., part of the channel 4 is arranged below the conductive adhesive layer 3, the conductive adhesive layer 3 above the channel 4 will collapse if the width b of the channel 4 is too large, which may cause the channel 4 to be blocked. Therefore, width range of the channel 4 in the embodiments of the present disclosure needs to be selected to avoid the conductive adhesive layer 3 from collapsing while ensuring gas discharge effect.

Figure 7:
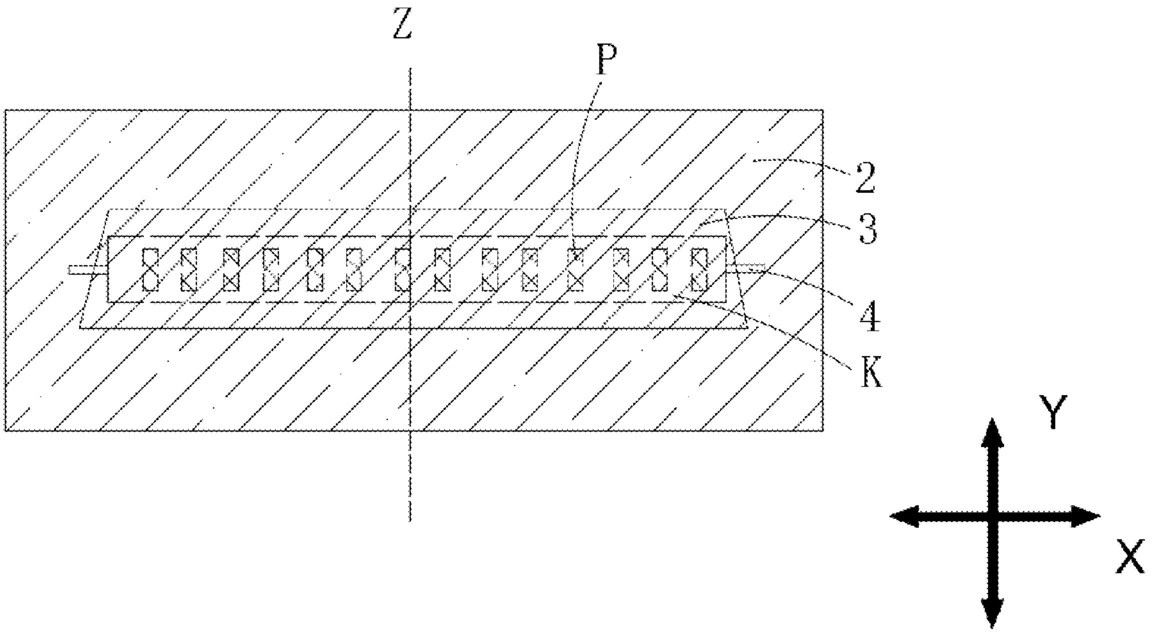
FIG. 7 is a top view showing relative positions of channels and a conductive adhesive layer according to an embodiment of the present disclosure.
Figure 8:
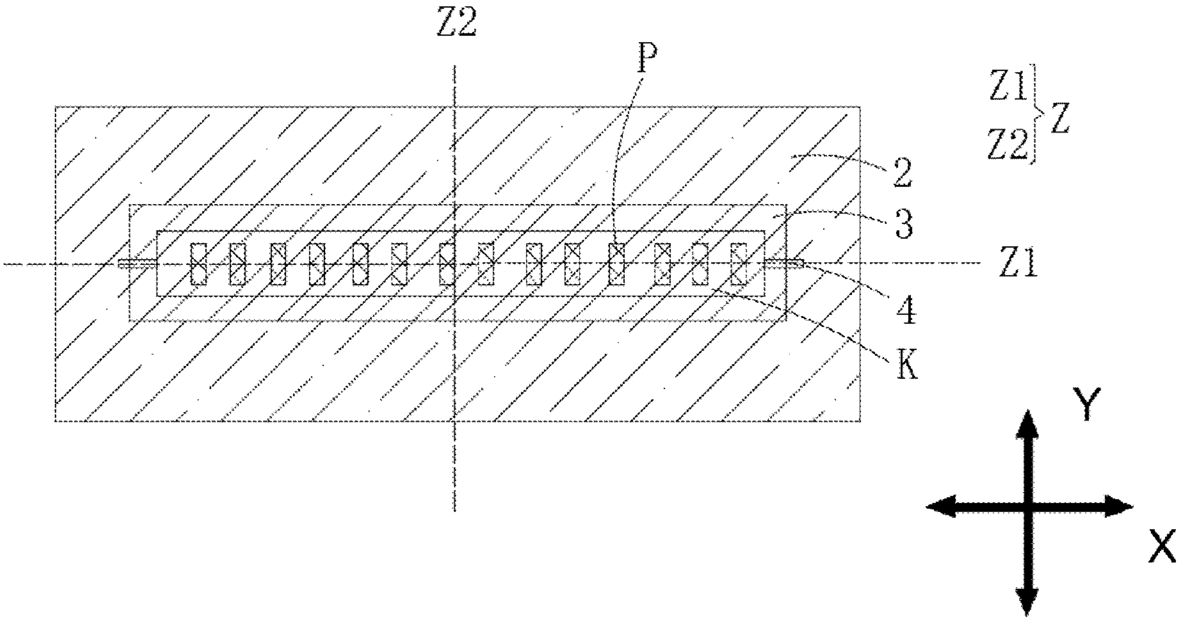
FIG. 8 is a top view showing relative positions of channels and a conductive adhesive layer according to another embodiment of the present disclosure.
Figure 9:
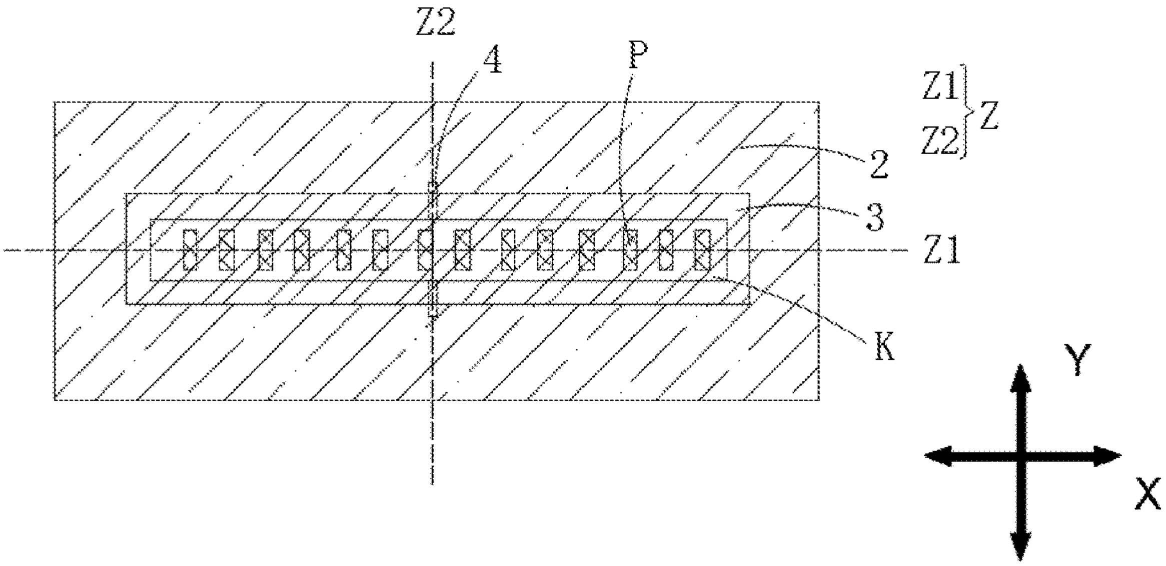
FIG. 9 is a top view showing relative positions of channels and a conductive adhesive layer according to another embodiment of the present disclosure.
Figure 10:
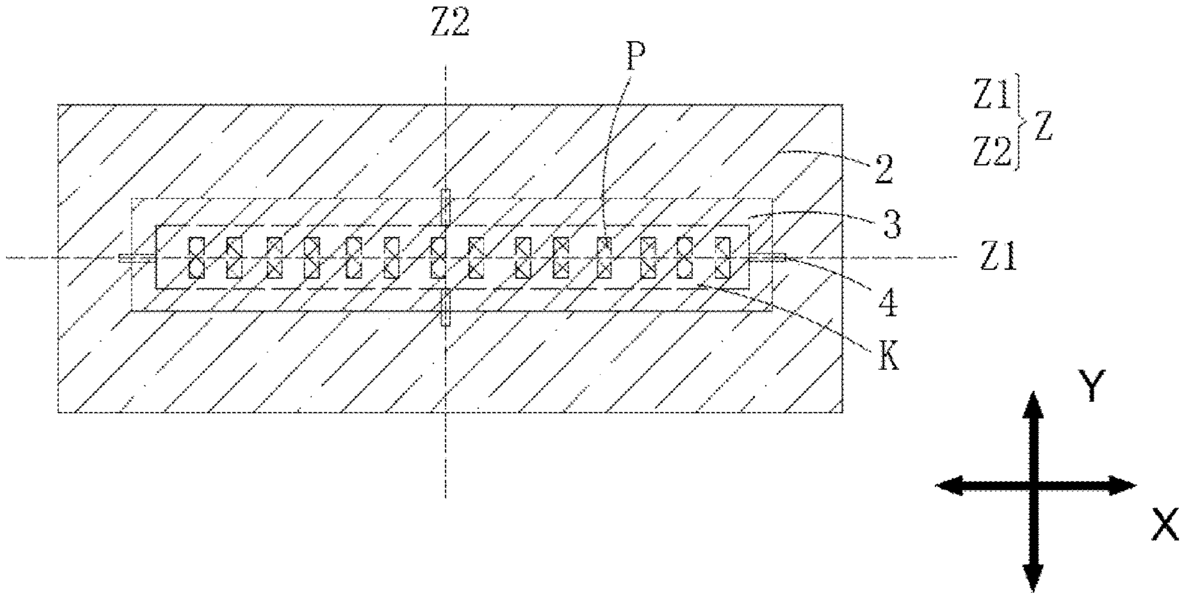
FIG. 10 is a top view showing relative positions of channels and a conductive adhesive layer according to another embodiment of the present disclosure.
Figure 11:
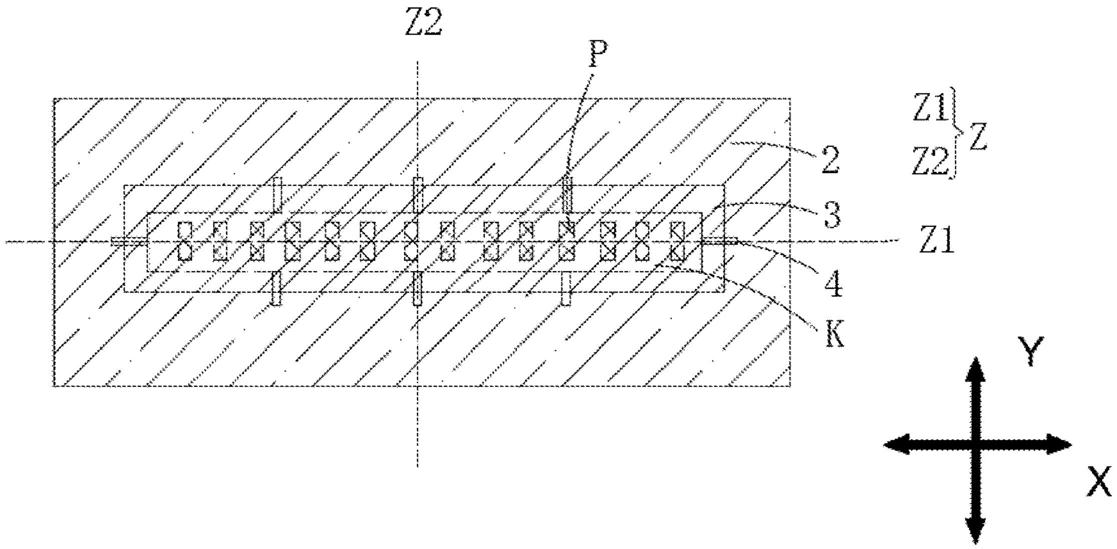
FIG. 11 is a top view showing relative positions of channels and a conductive adhesive layer according to another embodiment of the present disclosure.

FIG. 7 is a top view showing relative positions of the channels and the conductive adhesive layer according to an embodiment of the present disclosure. FIG. 8 is a top view showing relative positions of the channels and the conductive adhesive layer according to another embodiment of the present disclosure. FIG. 9 is a top view showing relative positions of the channels and the conductive adhesive layer according to another embodiment of the present disclosure. FIG. 10 is a top view showing relative positions of the channels and the conductive adhesive layer according to another embodiment of the present disclosure. FIG. 11 is a top view showing relative positions of the channels and the conductive adhesive layer according to another embodiment of the present disclosure.

In some embodiments, the display panel includes at least two channels 4, and each channel 4 is arranged around the accommodation groove K.

It can be understood that the more channels 4 are provided, the higher the gas discharge efficiency of the channels 4 for the gas in the accommodation groove K when the conductive adhesive layer 3 is squeezed, and the less likely the conductive adhesive layer 3 is to have bubbles or holes. Three, four, or more channels 4 can be arranged around the accommodation groove K according to size of the accommodation groove K. But along a peripheral direction of the accommodation groove K, distance between two adjacent channels 4 should not be too close, so as to avoid problem that the insulating layer 2 cannot effectively support the conductive adhesive layer 3 due to densely arrangement of the channels 4.

Referring to FIGS. 7 to 11, in some embodiments, the conductive adhesive layer 3 includes at least one centerline Z, where at least two channels 4 are arranged symmetrically with the centerline Z as a symmetry axis.

It can be understood that number of centerlines of the conductive adhesive layer 3 is determined by shape of the orthographic projection of the conductive adhesive layer 3 on the substrate 1. For example, as shown in FIG. 7, when the orthographic projection of the conductive adhesive layer on the substrate 1 is an isosceles trapezoid, the conductive adhesive layer 3 has only one centerline Z, and at least two channels 4 are arranged symmetrically with this centerline Z as the symmetry axis.

While when the orthographic projection of the conductive adhesive layer 3 on the substrate 1 is in a shape of a rectangle, a circle, an ellipse, etc., the conductive adhesive layer 3 has two or more centerlines Z. In some embodiments, as shown in FIGS. 8 to 11, the orthographic projection of the conductive adhesive layer 3 on the substrate 1 is rectangular, and the centerlines Z of the conductive adhesive layer 3 includes a first centerline Z1 and a second centerline Z2. The first centerline Z1 extends along a first direction, and the second centerline Z2 extends along a second direction. The first direction intersects with the second direction, and the first centerline Z1 and the second centerline Z2 are two symmetry axes of the rectangle. Here, the first direction is, for example, X direction shown in FIGS. 8 to 11, and the second direction is, for example, Y direction shown in FIGS. 8 to 11.

In some other embodiments, the orthographic projection of the conductive adhesive layer 3 on the substrate 1 can be another shape, such as a rhombus, an ellipse, etc. When the orthographic projection of the conductive adhesive layer 3 on the substrate 1 is an ellipse, the first centerline Z1 and the second centerline Z2 of the conductive adhesive layer 3 are major axis and minor axis of the ellipse.

In some embodiments, at least two channels 4 can be arranged symmetrically with the first centerline Z1 and/or the second centerline Z2 as the symmetry axis. For example, as shown in FIG. 8, two channels 4 are arranged symmetrically with the second centerline Z2 as the symmetry axis. As shown in FIG. 9, two channels 4 are arranged symmetrically with the first centerline Z1 as the symmetry axis. As shown in FIG. 10, while two channels 4 are arranged symmetrically with the first centerline Z1 as the symmetry axis, two channels 4 are arranged symmetrically with the second centerline Z2 as the symmetry axis.

In addition, according to length of the conductive adhesive layer 3 along an extension direction of the first centerline Z1 and that along an extension direction of the second centerline Z2, number of channels 4 can be adjusted correspondingly. For example, when the length of the conductive adhesive layer 3 along the extension direction of the first centerline Z1 is greater than that along the extension direction of the second centerline Z2, the number of channels 4 arranged symmetrically with the first centerline Z1 as the symmetry axis may be greater than the number of channels 4 arranged symmetrically with the second centerline Z2 as the symmetry axis.

For example, as shown in FIG. 11, four, six, or more channels 4 may be arranged symmetrically with the first centerline Z1 as the symmetry axis, while no channel 4 is arranged or two channels 4 are arranged symmetrically with the second centerline Z2 as the symmetry axis. It should be noted that two channels 4 are arranged symmetrically with the second centerline Z2 as the symmetry axis refers to that one channel 4 is respectively arranged on both sides of the second centerline Z2, and correspondingly, four channels 4 are arranged symmetrically with the first centerline Z1 as the symmetry axis refers to that that two channels 4 are respectively arranged on both sides of the first centerline Z1, and so on.

In some embodiments, the conductive adhesive layer 3 includes at least one centerline Z, and at least two channels 4 may be arranged symmetrically with the centerline Z as the symmetry axis. In this way, gas impact on the insulating layer 2 and/or the conductive adhesive layer 3 can be evenly relieved when the gas is discharged from the channels 4, so as to avoid negative effects on the insulating layer 2 and/or the conductive adhesive layer 3 due to excessive air pressure in a certain channel 4.

Figure 12:
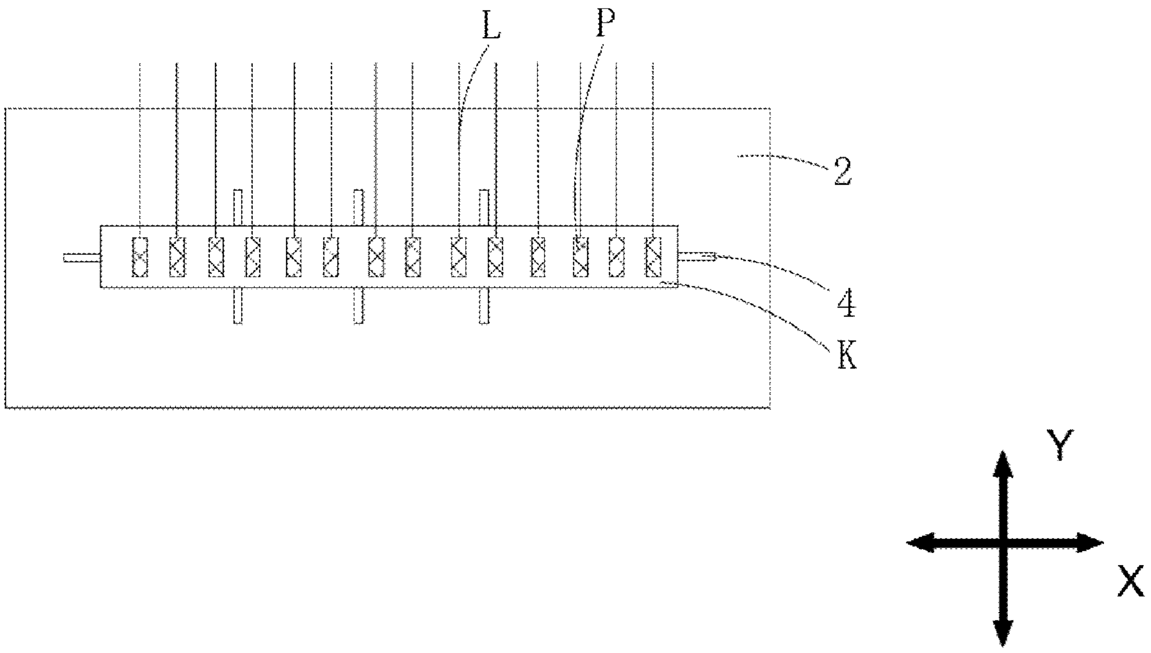
FIG. 12 is a top view showing relative positions of channels and signal lines according to an embodiment of the present disclosure.

FIG. 12 is a top view showing relative positions of the channels and signal lines according to an embodiment of the present disclosure. In some embodiments, the display panel also includes signal lines L electrically connected to the first electrodes P, and the signal lines L are at least partially arranged between the substrate 1 and the insulating layer 2. Along the direction N perpendicular to the plane where the substrate 1 is located, orthographic projections of the signal lines L on the substrate 1 and the orthographic projections of the channels 4 on the substrate 1 do not overlap.

It can be understood that the channels 4 need to be arranged to avoid the signal lines L, so as to prevent the signal lines L from being damaged when the gas is discharged from the channels 4. Also, if the signal lines L pass through the channels 4, the gas will be blocked to a certain extent, which is not conducive to rapid discharge of gas. Therefore, in some embodiments, along the direction N perpendicular to the plane where the substrate 1 is located, orthographic projections of the signal lines L on the substrate 1 and the orthographic projections of the channels 4 on the substrate 1 do not to overlap, so that there are certain distances between the channels 4 and the signal lines L.

In some embodiments, according to different signals to be transmitted, the signal lines L may be, for example, data signal lines, power supply voltage signals, etc., and there is no particular limitation thereto, as long as the channels 4 and the signal lines L do not interfere with each other.

Figure 13:
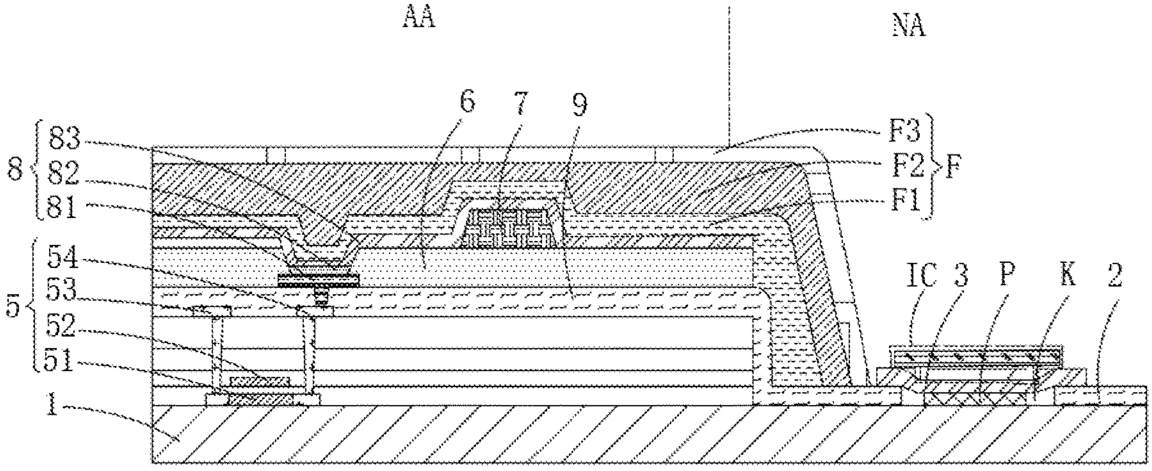
FIG. 13 is a schematic cross-sectional view along direction C-C in FIG. 3 according to an embodiment of the present disclosure.
Figure 14:
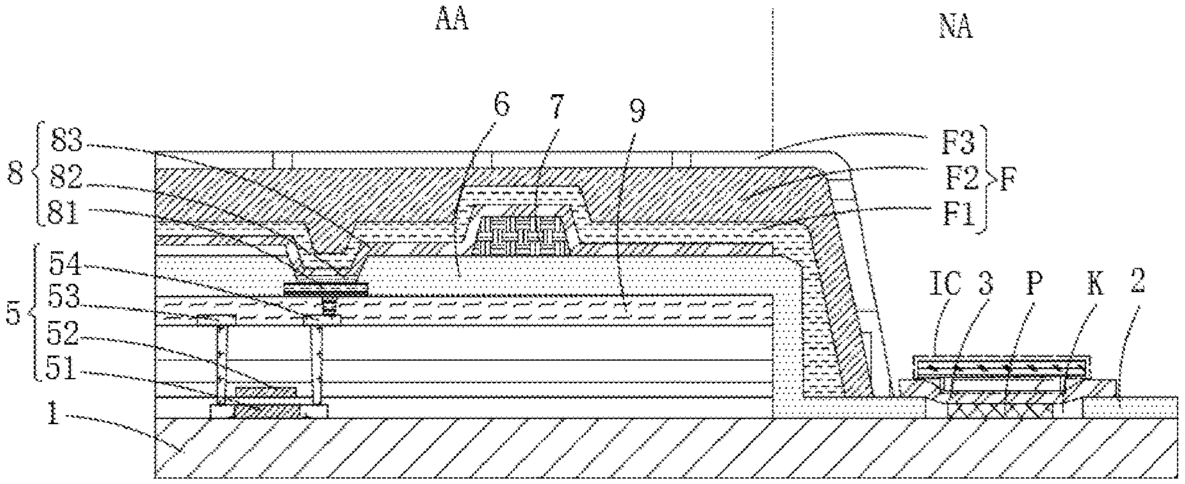
FIG. 14 is a schematic cross-sectional view along direction C-C in FIG. 3 according to another embodiment of the present disclosure.
Figure 15:
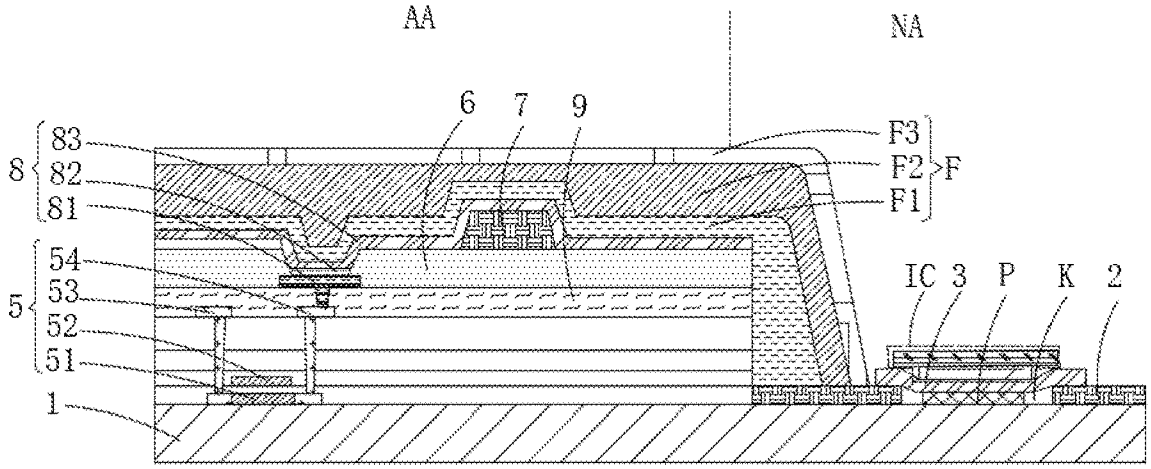
FIG. 15 is a schematic cross-sectional view along direction C-C in FIG. 3 according to another embodiment of the present disclosure.

FIG. 13 is a schematic cross-sectional view along direction C-C in FIG. 3 according to an embodiment of the present disclosure. FIG. 14 is a schematic cross-sectional view along direction C-C in FIG. 3 according to another embodiment of the present disclosure. FIG. 15 is a schematic cross-sectional view along direction C-C in FIG. 3 according to another embodiment of the present disclosure.

In some embodiments, the display panel includes the display area AA and the non-display area NA. The display area AA includes a driving circuit layer 5, a planarization layer 9, a pixel definition layer 6, and a support layer 7 that are arranged along a direction away from the substrate 1. The insulating layer 2 is located in the non-display area NA, and the insulating layer 2 is arranged in the same layer with at least one of the planarization layer 9, the pixel definition layer 6, and the support layer 7.

In order to facilitate readers to understand specific arrangement positions of the above-mentioned film layer structure, structures of the display panel are briefly introduced below.

In some embodiments, the driving circuit layer 5 includes a thin film transistor, and the thin film transistor includes an active layer 51, a gate 52, a source 53, and a drain 54. Materials of the drain 54, the source 53, and the gate 52 may include one or a combination of molybdenum, titanium, aluminum, copper, etc. The gate 52 of the thin film transistor is usually configured to receive control signals, so that the thin film transistor is turned on or off under control of the control signals. The thin film transistor may have a top-gate structure or a bottom-gate structure. In the embodiments of the present disclosure, an example in which the thin film transistor has the top-gate structure is used for illustration.

In some embodiments, the display panel also includes a display device layer 8, and the display device layer 8 includes a first electrode layer 81, a light emission layer 82, and a second electrode layer 83 that are stacked along the direction perpendicular to the plane where the substrate 1 is located. The pixel definition layer 6 includes a pixel opening, and the display device layer 8 is at least partially located within the pixel opening. The source 53 or the drain 54 of the thin film transistor is electrically connected to the first electrode layer 81, so as to control light emission of the light emission layer 82. The planarization layer 9 is usually arranged between the pixel definition layer 6 and the driving circuit layer 5, so as to ensure flat arrangement of the display device layer 8.

Material of the first electrode layer 81 is generally a material with a high work function in order to improve hole injection efficiency. In some embodiments, the first electrode layer 81 is an anode layer. The anode layer may have a single layer structure or a stacked layer structure. In some examples, the anode layer has the single layer structure, and material of the anode layer includes gold (Au), platinum (Pt), titanium (Ti), silver (Ag), indium tin oxide (ITO), zinc tin oxide (IZO), or a transparent conductive polymer (such as polyaniline). In some other examples, the anode layer has the stacked layer structure, such as stacked layers of indium tin oxide (ITO)-silver (Ag)-indium tin oxide (ITO).

Material of the second electrode layer 83 is generally a material with a lower work function in order to facilitate electron injection, which can also reduce heat generated during operation and prolong service life of an OLED device. In some embodiments, the second electrode layer 83 is a cathode layer. Material of the cathode layer may be one of metal materials such as silver (Ag), aluminum (Al), lithium (Li), magnesium (Mg), ytterbium (Yb), calcium (Ca), or indium (In), and may also be an alloy of the aforementioned metal materials, such as magnesium-silver alloy (Mg/Ag) or lithium-aluminum alloy (Li/Al), which is not limited herein.

It should be noted that the insulating layer 2 can be formed by the same process as one of the planarization layer 9, the pixel definition layer 6, and the support layer 7. Also, considering that the planarization layer 9, the pixel definition layer 6, and the support layer 7 are all made of organic materials, which are, for example, organic glue materials such as hexamethyldisiloxane, epoxy resin, or polyimide, and the above materials also have a certain insulating effect, the insulating layer 2 can also be made of the same material as one of the planarization layer 9, the pixel definition layer 6, and the support layer 7, so as to reduce production cost. The insulating layer 2, the planarization layer 9, the pixel definition layer 6, and the support layer 7 can be formed by processes such as inkjet printing or coating.

As shown in FIG. 13, the insulating layer 2 is arranged in the same layer as the planarization layer 9, or as shown in FIG. 14, the insulating layer 2 is arranged in the same layer as the pixel definition layer 6. In some other embodiments, the insulating layer 2 is arranged in the same layer as the support layer 7 alone, as shown in FIG. 15, or the insulating layer 2 can be arranged in the same layer as two or three of the planarization layer 9, the pixel definition layer 6, and the support layer 7, and there is no particular limitation thereto.

In some embodiments, the display panel also includes an encapsulation layer F, and the encapsulation layer F is at least partially arranged at one side of the display device layer 8 away from the substrate 1, so as to improve encapsulation effect of the display panel. The encapsulation layer F may have an organic encapsulation layer or an inorganic-organic-inorganic composite encapsulation layer. For example, the encapsulation layer F includes a first inorganic encapsulation layer F1, a first organic encapsulation layer F2, and a second inorganic encapsulation layer F3 that are stacked. A main advantage of fabricating the encapsulation layer F with organic materials is better flatness thereof to realize planarization, which is conducive to subsequent growth of inorganic films by methods such as chemical vapor deposition, physical vapor deposition, or atomic layer deposition. The organic materials with larger thickness can also be prepared by existing processes, and the organic materials have better bending resistance.

Considering that inorganic materials have relatively better insulation, the insulating layer 2 can also be made of inorganic materials. For example, the insulating layer 2 can be arranged in the same layer as at least one of the first inorganic encapsulation layer F1 and the second inorganic encapsulation layer F3, and there is no particular limitation thereto.

Figure 16:
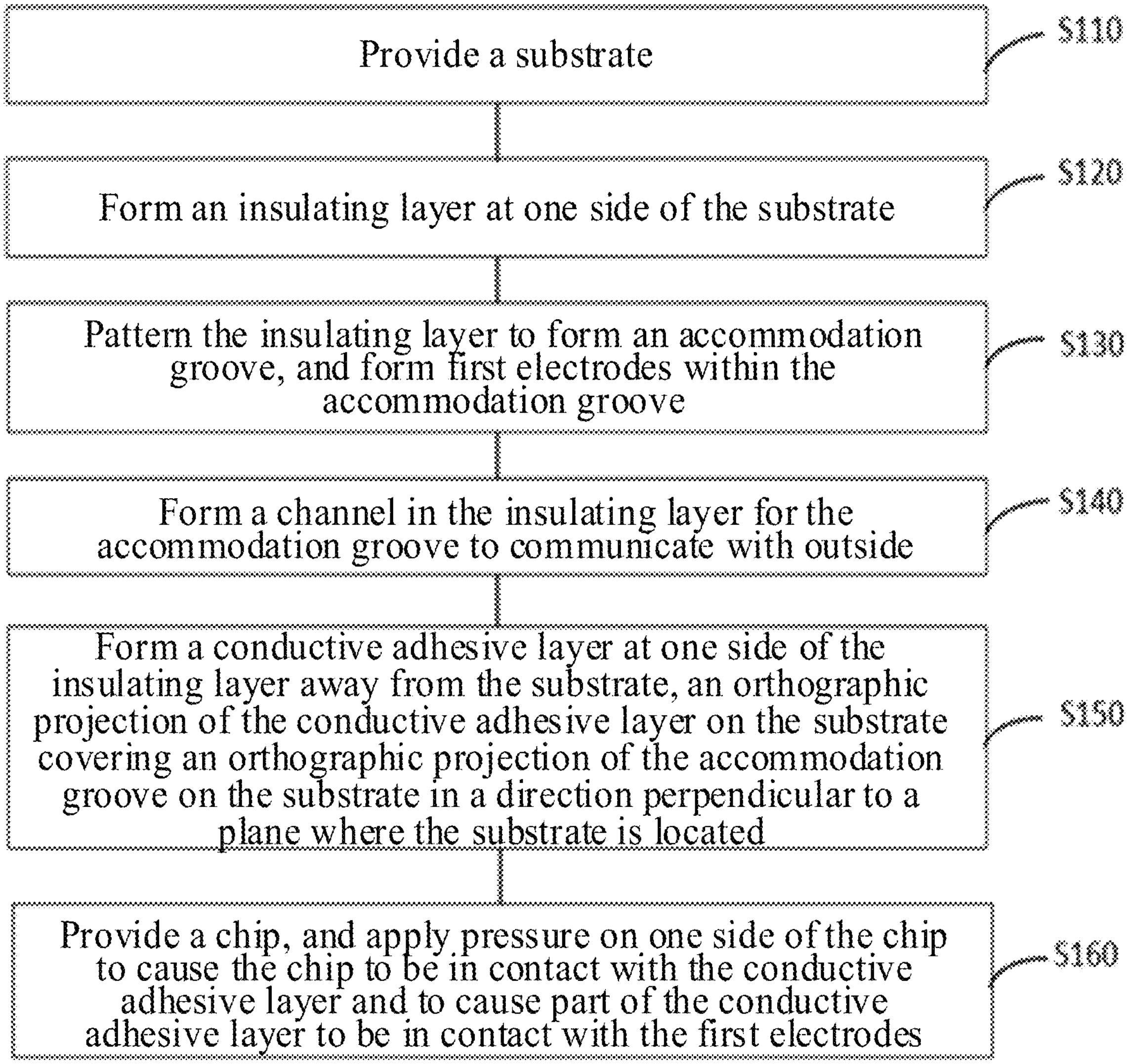
FIG. 16 is a flow chart of a fabrication method of a display panel according to an embodiment of the present disclosure.

FIG. 16 is a flow chart of a fabrication method of the display panel according to an embodiment of the present disclosure. The embodiments of the present disclosure also provide a fabrication method of the display panel, which is used to fabricate the display panel in some embodiments described above. The fabrication method of the display panel includes the following processes.

S110, providing a substrate.

S120, forming an insulating layer at one side of the substrate.

S130, patterning the insulating layer to form an accommodation groove, and forming first electrodes within the accommodation groove.

S140, forming a channel in the insulating layer for the accommodation groove to communicate with the outside.

S150, forming a conductive adhesive layer at one side of the insulating layer away from the substrate, an orthographic projection of the conductive adhesive layer on the substrate covering an orthographic projection of the accommodation groove on the substrate along a direction perpendicular to a plane where the substrate is located.

S160, providing a chip, and applying pressure on one side of the chip to cause the chip to be in contact with the conductive adhesive layer and to cause part of the conductive adhesive layer to be in contact with the first electrodes.

Technical effects that can be achieved by the display panel in some embodiments described above can also be achieved by the fabrication method of the display panel, which will not be described in detail herein.

The fabrication method of the display panel will be described in detail below with reference to FIGS. 17 to 22.

Figure 17:
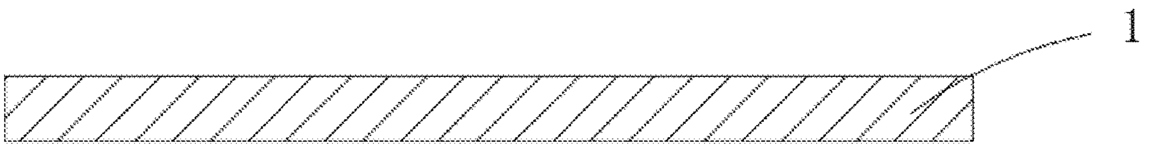
FIG. 17 is a schematic cross-sectional view of a structure obtained in process S110 in a fabrication method of a display panel according to an embodiment of the present disclosure.

In process S110, as shown in FIG. 17, the substrate 1 is provided.

In some embodiments, the substrate 1 may be a hard substrate, such as a glass substrate, or a flexible substrate. The material may be polyimide, polystyrene, polyethylene terephthalate, parylene, polyethersulfone, polyethylene naphthalate, etc., and there is no particular limitation thereto.

Figure 18:
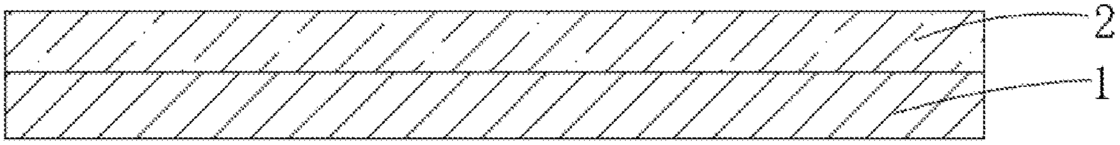
FIG. 18 is a schematic cross-sectional view of a structure obtained in process S120 in a fabrication method of a display panel according to an embodiment of the present disclosure.

In process S120, as shown in FIG. 18, the insulating layer 2 is formed at one side of the substrate 1.

In some embodiments, the insulating layer 2 may be formed by processes such as evaporation, coating, inkjet printing (IJP), atomic layer deposition (ALD), chemical vapor deposition (CVD), plasma enhanced chemical vapor deposition (PECVD), etc.

Figure 19:
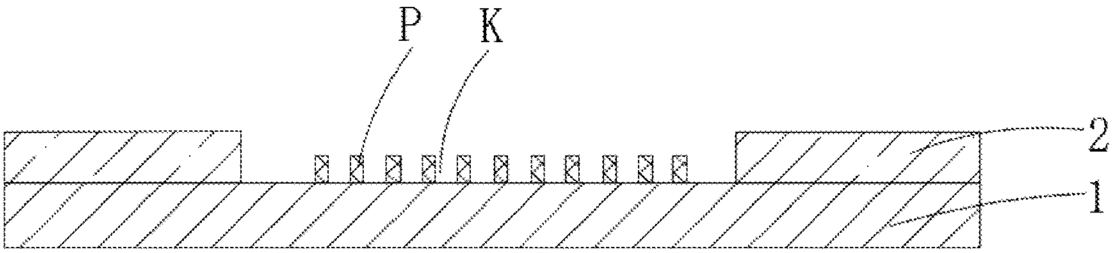
FIG. 19 is a schematic cross-sectional view of a structure obtained in process S130 in a fabrication method of a display panel according to an embodiment of the present disclosure.

In process S130, as shown in FIG. 19, the insulating layer 2 is patterned to form the accommodation groove K, and the first electrodes P are formed within the accommodation groove K.

In some embodiments, the accommodation groove K may be formed in the insulating layer 2 by a photolithography process. For example, when the accommodation groove K is formed by the photolithography process, a photoresist can be coated on the insulating layer 2 first, and then the photoresist is patterned. The photoresist can be divided into two types: negative and positive. It is a negative gel if it forms an insoluble substance after being illuminated, and on the contrary, it is a positive gel if it is insoluble to some solvents and becomes a soluble substance after being illuminated. The positive gel can be used in some embodiments, where the photoresist is patterned through a mask plate corresponding to structural shape of the accommodation groove K to be formed.

For example, process of patterning the photoresist includes using a patterned mask plate to expose part of the photoresist, and removing exposed part of the photoresist to form a patterned photoresist. First, the mask plate is arranged above the photoresist, and an appropriate light source is used to illuminate the mask plate, so that part of the light passes through the mask plate and enters the photoresist to expose the photoresist. Then, the exposed part of the photoresist is removed by a reagent such as a developer solution to form the patterned photoresist. Next, the insulating layer 2 may be further etched by a dry etching process or a wet etching process to form the accommodation groove K.

It can be understood that in some embodiments, the first electrodes P may also be pre-formed on the substrate 1. Then the insulating layer 2 is formed, and the insulating layer 2 is patterned to form the accommodation groove K, so that the first electrodes P are exposed within the accommodation groove K.

Figure 20:
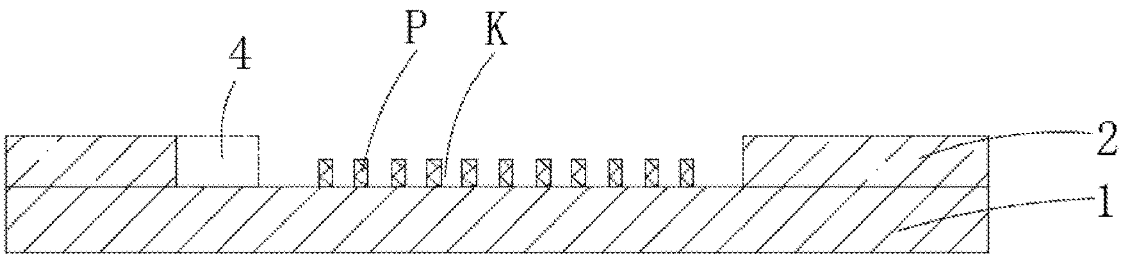
FIG. 20 is a schematic cross-sectional view of a structure obtained in process S140 in a fabrication method of a display panel according to an embodiment of the present disclosure.

In process S140, as shown in FIG. 20, the channel 4 is formed in the insulating layer 2 for the accommodation groove K to communicate with the outside.

In some embodiments, in process of forming the channel 4 in the insulating layer 2 for the accommodation groove K to communicate with the outside includes forming the channel 4 in the insulating layer 2 for the accommodation groove K to communicate with the outside by the photolithography process.

It can be understood that in some embodiments, the channel 4 may also be formed in other ways. For example, the insulating layer 2 can be directly illuminated with a laser, so as to remove part of the insulating layer 2 to form the channel 4.

Figure 21:
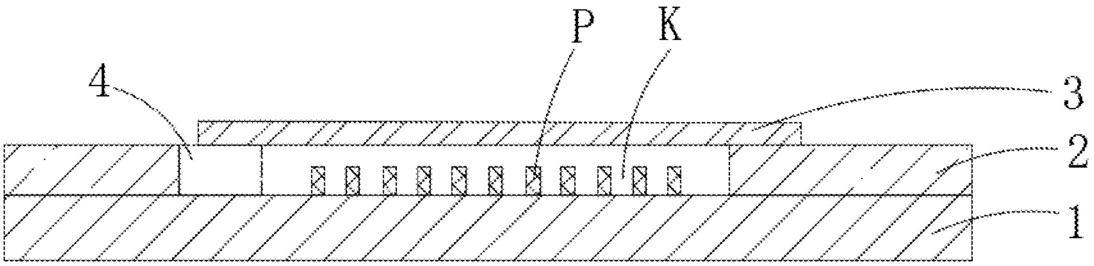
FIG. 21 is a schematic cross-sectional view of a structure obtained in process S150 in a fabrication method of a display panel according to an embodiment of the present disclosure.

In process S150, as shown in FIG. 21, the conductive adhesive layer 3 is formed at one side of the insulating layer 2 away from the substrate 1. Along the direction perpendicular to the plane where the substrate 1 is located, the orthographic projection of the conductive adhesive layer 3 on the substrate 1 covers the orthographic projection of the accommodation groove K on the substrate 1.

In some embodiments, the conductive adhesive layer 3 may be an anisotropic conductive film (ACF), and the anisotropic conductive film may be directly attached to one side of the insulating layer 2 away from the substrate 1.

Figure 22:
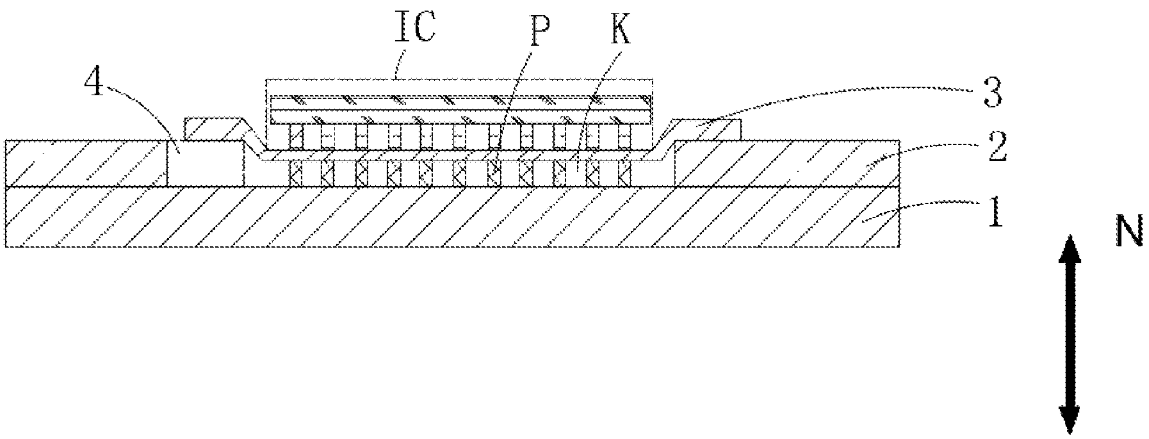
FIG. 22 is a schematic cross-sectional view of a structure obtained in process S160 in a fabrication method of a display panel according to an embodiment of the present disclosure.

In process S160, as shown in FIG. 22, the chip IC is provided, and pressure is applied on one side of the chip IC to cause the chip IC to be in contact with the conductive adhesive layer 3 and to cause part of the conductive adhesive layer 3 to be in contact with the first electrodes P.

In some embodiments, a crimping tool can be used to apply certain pressure on one side of the chip IC away from the substrate 1, so that the conductive adhesive layer 3 located between the chip IC and the first electrodes P can connect the chip IC and the first electrodes P, so as to achieve bonding.

The embodiments of the present disclosure also provide a display device, which includes the display panel in any of the embodiments described above.

The display device provided by the embodiments of the present disclosure has the technical effect in the technical solution of the display panel in any of the embodiments described above, and the explanation of the same or corresponding structure and terms as the embodiments described above will not be repeated herein. The display device provided by the embodiments of the present disclosure can be a mobile phone or any electronic product with display function, including but not limited to the following categories: a TV, a laptop, a desktop display, a tablet computer, a digital camera, a smart hand ring, smart glasses, an on-board display, a medical equipment, an industrial control equipment, a touch interactive terminal, etc. which is not particularly limited in the embodiments of the present disclosure.

Compared with related technologies, the display panel provided by the embodiments of the present disclosure includes the substrate, the insulating layer, the first electrodes, the conductive adhesive layer, and the chip. The orthographic projection of the conductive adhesive layer on the substrate covers the orthographic projection of the accommodation groove on the substrate, i.e., the conductive adhesive layer covers the accommodation groove, so as to ensure that the chip and the first electrodes can form a good electrical connection through the conductive adhesive layer. Also, the channel is provided in the insulating layer of the display panel for the accommodation groove to communicate with the outside. In this way, when the first electrodes and the chip are bonded and then the conductive adhesive layer is squeezed, the channel can be used to discharge gas located between the accommodation groove and the conductive adhesive layer to the outside, so as to maintain a balance of air pressure inside the accommodation groove and the outside. Therefore, bubbles or holes in the conductive adhesive layer can be avoided, which improves reliability of the display panel and meets specification requirements of customers.

It should be understood that the scope of the present disclosure is not limited hereto. Any person skilled in the art can easily conceive various equivalent modifications or substitutions within the technical scope disclosed in the present disclosure, and these modifications or substitutions should be within the scope of the present disclosure.

It should also be noted that the exemplary embodiments of the present disclosure describe some methods or systems based on a series of steps or devices. However, the present disclosure is not limited to the order of the above steps, that is, the steps may be performed in the order in the embodiments, or may be different from the order in the embodiments, or several steps may be performed at the same time.

What is claimed is:

1. A display panel comprising:

a substrate;

an insulating layer arranged at one side of the substrate;

a conductive adhesive layer arranged at one side of the insulating layer away from the substrate and including at least an edge portion extending along a top surface of the insulating layer at the one side; and a chip arranged at one side of the conductive adhesive layer away from the substrate;

wherein:

the insulating layer is provided with an accommodation groove, and first electrodes are arranged within the accommodation groove;

along a direction perpendicular to a plane where the substrate is located, an orthographic projection of the conductive adhesive layer on the substrate covers an orthographic projection of the accommodation groove on the substrate;

part of the conductive adhesive layer is in contact with the first electrodes, and the chip is in contact with the conductive adhesive layer; and a gas releasing channel is provided in the insulating layer to discharge gas located between the accommodation groove and the conductive adhesive layer to outside, the gas releasing channel including an inlet and an outlet, and the whole outlet being arranged at the top surface of the insulating layer at a position not covered by the chip.

2. The display panel according to claim 1, wherein along the direction perpendicular to the plane where the substrate is located, an orthographic projection of the channel on the substrate and the orthographic projection of the conductive adhesive layer on the substrate partially overlap, and the orthographic projection of the channel on the substrate extends a predetermined distance away from the first electrodes relative to the orthographic projection of the conductive adhesive layer on the substrate.

3. The display panel according to claim 2, wherein the channel passes through the insulating layer and exposes part of the substrate.

4. The display panel according to claim 2, wherein size of the channel along the direction perpendicular to the plane where the substrate is located is smaller than size of the insulating layer along the direction perpendicular to the plane where the substrate is located.

5. The display panel according to claim 2, wherein the predetermined distance is greater than or equal to 1 μm.

6. The display panel according to claim 1, wherein in a plane parallel to the substrate and along a direction perpendicular to an extension direction of the channel, width of the channel ranges from 4 μm to 10 μm.

7. The display panel according to claim 1, wherein the display panel includes at least two channels, each channel being arranged around the accommodation groove.

8. The display panel according to claim 7, wherein the conductive adhesive layer includes at least one centerline, at least two channels being arranged symmetrically with the centerline as a symmetry axis.

9. The display panel according to claim 1, further comprising:

signal lines electrically connected to the first electrodes, the signal lines being at least partially arranged between the substrate and the insulating layer;

wherein:

along the direction perpendicular to the plane where the substrate is located, orthographic projections of the signal lines on the substrate and the orthographic projections of the channels on the substrate do not overlap.

10. The display panel according to claim 1, wherein:

the display panel includes a display area and a non-display area;

the display area includes a driving circuit layer, a planarization layer, a pixel definition layer, and a support layer that are arranged along a direction away from the substrate; and the insulating layer is located in the non-display area, and the insulating layer is arranged in a same layer with at least one of the planarization layer, the pixel definition layer, and the support layer.

11. The display panel according to claim 1, wherein the conductive adhesive layer is an anisotropic conductive film.

12. A display panel, comprising:

a substrate;

an insulating layer arranged at one side of the substrate;

a conductive adhesive layer arranged at one side of the insulating layer away from the substrate and including at least an edge portion extending along a top surface of the insulating layer at the one side; and a chip arranged at one side of the conductive adhesive layer away from the substrate;

wherein:

the insulating layer is provided with an accommodation groove, and first electrodes are arranged within the accommodation groove;

along a direction perpendicular to a plane where the substrate is located, an orthographic projection of the conductive adhesive layer on the substrate covers an orthographic projection of the accommodation groove on the substrate;

part of the conductive adhesive layer is in contact with the first electrodes, and the chip is in contact with the conductive adhesive layer;

a gas releasing channel is provided in the insulating layer for the accommodation groove to communicate with outside;

the substrate includes a first surface, the first electrodes being arranged at the first surface;

the insulating layer includes a second surface and a side surface, the second surface being parallel to the first surface, and the side surface connecting the first surface and the second surface; and the channel includes an inlet and an outlet, the inlet being arranged at the side surface, and the whole outlet being arranged at the second surface at a position not covered by the chip.

13. The display panel according to claim 12, wherein:

the channel includes a first hole segment and a second hole segment that are connected, an extension direction of the first hole segment being parallel to the first surface, and an extension direction of the second hole segment being perpendicular to the first surface; and along a direction perpendicular to the first surface, an orthographic projection of the first hole segment on the substrate and the orthographic projection of the conductive adhesive layer on the substrate partially overlap, and an orthographic projection of the second hole segment on the substrate and the orthographic projection of the conductive adhesive layer on the substrate do not overlap.

14. A display device comprising:

a display panel, wherein the display panel includes:

a substrate;

an insulating layer arranged at one side of the substrate;

a conductive adhesive layer arranged at one side of the insulating layer away from the substrate and including at least an edge portion extending along a top surface of the insulating layer at the one side; and a chip arranged at one side of the conductive adhesive layer away from the substrate;

wherein:

the insulating layer is provided with an accommodation groove, and first electrodes are arranged within the accommodation groove;

along a direction perpendicular to a plane where the substrate is located, an orthographic projection of the conductive adhesive layer on the substrate covers an orthographic projection of the accommodation groove on the substrate;

part of the conductive adhesive layer is in contact with the first electrodes, and the chip is in contact with the conductive adhesive layer; and a gas releasing channel is provided in the insulating layer to discharge gas located between the accommodation groove and the conductive adhesive layer to outside, the gas releasing channel including an inlet and an outlet, and the whole outlet being arranged at the top surface of the insulating layer at a position not covered by the chip.

* * * * *